United States Patent
Kato et al.

(10) Patent No.: US 7,156,923 B2
(45) Date of Patent: *Jan. 2, 2007

(54) SILICON NITRIDE FILM FORMING METHOD, SILICON NITRIDE FILM FORMING SYSTEM AND SILICON NITRIDE FILM FORMING SYSTEM PRECLEANING METHOD

(75) Inventors: Hitoshi Kato, Esashi (JP); Kohei Fukushima, Esashi (JP); Atsushi Endo, Nirasaki (JP); Tatsuo Nishita, Esashi (JP); Takeshi Kumagai, Esashi (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/986,282

(22) Filed: Nov. 12, 2004

(65) Prior Publication Data

US 2005/0081789 A1  Apr. 21, 2005

Related U.S. Application Data

(62) Division of application No. 10/066,627, filed on Feb. 6, 2002, now Pat. No. 6,844,273.

(30) Foreign Application Priority Data

Feb. 7, 2001 (JP) ............................. 2001-030344

(51) Int. Cl.
*C23C 16/00* (2006.01)
*C23C 16/34* (2006.01)
*C23C 16/52* (2006.01)
*H01L 21/31* (2006.01)
*H01L 21/469* (2006.01)

(52) U.S. Cl. .................. 118/715; 438/791; 438/778; 438/905; 427/255.39; 427/255.393; 134/1; 134/1.3

(58) Field of Classification Search ............... 118/715; 438/791, 778, 905; 427/255.39, 255.393; 134/1, 1.3

See application file for complete search history.

(56) References Cited

U.S. PATENT DOCUMENTS 5,482,739 A  1/1996  Hey et al.

(Continued)

FOREIGN PATENT DOCUMENTS

JP  08-176829  7/1996

(Continued)

OTHER PUBLICATIONS

R.C. Taylor et al., "LPCVD of Silicon Nitride Films From Hexachlorodisilane and Ammonia", 1988, Materials Research Society, vol. 105, pp. 319-324.

(Continued)

*Primary Examiner*—Jeffrie R. Lund
(74) *Attorney, Agent, or Firm*—Smith, Gambrell, & Russell, LLP

(57) ABSTRACT

A thermal processing system (1) includes a reaction vessel (2) capable of forming a silicon nitride film on semiconductor wafers (10) through interaction between hexachlorodisilane and ammonia, and an exhaust pipe (16) connected to the reaction vessel (2). The reaction vessel 2 is heated at a temperature in the range of 500 to 900° C. and the exhaust pipe (16) is heated at 100° C. before disassembling and cleaning the exhaust pipe 16. Ammonia is supplied through a process gas supply pipe (13) into the reaction vessel (2), and the ammonia is discharged from the reaction vessel (2) into the exhaust pipe (16).

6 Claims, 5 Drawing Sheets

U.S. PATENT DOCUMENTS

| | | | |
|---|---|---|---|
| 5,484,484 A | 1/1996 | Yamaga et al. | |
| 6,159,298 A | 12/2000 | Saito | |
| 6,242,347 B1 | 6/2001 | Vasudev et al. | |
| 6,268,299 B1 | 7/2001 | Jammy et al. | |
| 6,284,583 B1 | 9/2001 | Saida et al. | |
| 6,333,547 B1 | 12/2001 | Tanaka et al. | |
| 6,354,241 B1 | 3/2002 | Tanaka et al. | |
| 6,383,300 B1 * | 5/2002 | Saito et al. | 118/715 |
| 6,486,083 B1 | 11/2002 | Mizuno et al. | |
| 6,495,476 B1 | 12/2002 | Lee et al. | |
| 6,807,971 B1 * | 10/2004 | Saito et al. | 134/22.11 |
| 6,844,273 B1 * | 1/2005 | Kato et al. | 438/791 |
| 2002/0106909 A1 * | 8/2002 | Kato et al. | 438/791 |
| 2005/0081789 A1 * | 4/2005 | Kato et al. | 118/722 |

FOREIGN PATENT DOCUMENTS

| | | |
|---|---|---|
| JP | 10-125666 | 5/1998 |
| JP | 2000-138171 | 5/2000 |
| JP | 2000-174007 | 6/2000 |

OTHER PUBLICATIONS

Tanaka et al., "Film Properties of Low-k Silicon Nitride Films Formed by Hexachlorodisilane and Ammonia", 2000, Journal of the Electrochemical Society, pp. 2284-2289.

* cited by examiner

SILICON NITRIDE FILM FORMING METHOD, SILICON NITRIDE FILM FORMING SYSTEM AND SILICON NITRIDE FILM FORMING SYSTEM PRECLEANING METHOD

CROSS REFERENCE TO RELATED APPLICATIONS

This application is a division of Ser. No. 10/066,627, filed Feb. 6, 2002 now U.S. Pat. No. 6,844,273 which is being incorporated in its entirety herein by reference.

FIELD OF THE INVENTION

The present invention relates to a silicon nitride film forming method, a silicon nitride forming system and a silicon nitride film forming system precleaning method. More specifically, the present invention relates to a silicon nitride film forming method that forms a silicon nitride film on a workpiece by supplying hexachlorodisilane and ammonia into the workpiece, a silicon nitride film forming system for carrying out the method, and a precleaning method of cleaning the silicon nitride film forming system.

DESCRIPTION OF THE RELATED ART

A semiconductor device fabricating process forms a thin silicon nitride film on a workpiece, such as a semiconductor wafer. A silicon nitride film is excellent in insulating performance and corrosion resistance and is used prevalently as an insulating film and a masking film for impurity diffusion and ion implantation. A silicon nitride film is formed, for example, by a chemical vapor deposition process (CVD process). The CVD process uses a thermal processing system 51 as shown in FIG. 6. A silicon nitride film is formed on a semiconductor wafer by the following process.

A double-wall reaction tube 52 consisting of an inner tube 52a and an outer tube 52b is heated at a predetermined temperature in the range of, for example, 550 to 650° C. by a heater 53. A wafer boat 55 holding a plurality of semiconductor wafers 54 is loaded into the reaction tube 52 (inner tube 52a). Gases are discharged through an exhaust port 56 from the reaction tube 52 to evacuate the reaction tube 52 to a predetermined pressure in the range of, for example, 13.3 to 266 Pa (0.1 to 2 Torr). After the reaction tube 52 has been evacuated to the predetermined pressure, hexachlorodisilane ($Si_2Cl_6$) and ammonia $NH_3$ are supplied through a gas supply pipe 57 into the inner tube 52a to form a silicon nitride film on the semiconductor wafers 54.

An exhaust gas containing reaction products produced by a thermal process is exhausted through the exhaust port 56 and an exhaust pipe 58 by a vacuum pump 59 and is discharged outside from the thermal processing system 51. A trap 60 is placed in the exhaust pipe 58 to remove the reaction products from the exhaust gas.

It is difficult to discharge all the exhaust gas outside the thermal processing system 51, and the reaction products deposit unavoidably on the exhaust port 56 and the exhaust pipe 58. If the silicon nitride film forming process is carried out by the thermal processing system 51 with the reaction products deposited on the exhaust port 56 and the exhaust pipe 58, the deposited reduction products come off the thermal processing system 51 and produce particles. If the particles float in the thermal processing system 51 and adhere to the semiconductor wafers 54, the yield of semiconductor devices fabricated by using those semiconductor wafers 54 is reduced. The reaction products removed from the exhaust gas accumulate in the trap 60.

Maintenance work for removing the deposited reaction products from the parts of the thermal processing system 51 is performed periodically, in which parts including the exhaust pipe 58 and the trap 60 are removed from the thermal processing system 51 and are cleaned by using, for example, hydrofluoric acid (HF solution) to remove the reaction products.

When hexachlorodisilane and ammonia, i.e., source gases, are heated and reacted to each other, a Si—Cl—N—H compound, an intermediate product, is produced. Thus, the reaction products discharged into the exhaust pipe 58 include the Si—Cl—N—H compound. The Si—Cl—N—H compound is subject to hydrolysis. When the Si—Cl—N—H compound is hydrolyzed, hydrochloric acid is produced, reaction heat is generated and hydrolysates are produced. Therefore, when the exhaust pipe 58 coated with the Si—Cl—N—H compound is removed from the thermal processing system 51, the Si—Cl—N—H compound is exposed to the atmosphere and is hydrolyzed, and hydrochloric acid gas is produced.

SUMMARY OF THE INVENTION

The present invention has been made in view of the foregoing problem and it is therefore an object of the present invention to provide a silicon nitride film forming method and a silicon nitride film forming system capable of forming a silicon nitride film on a workpieces without depositing a Si—Cl—N—H compound in an exhaust system.

Another object of the present invention is to provide a silicon nitride film forming system precleaning method capable of removing a hexachlorodisilane polymer deposited in an exhaust system.

According to the present invention, a silicon nitride film forming system includes: a reaction vessel capable of holding workpieces therein and provided with a first heating unit for heating workpieces at a process temperature; gas supply pipes for carrying hexachlorodisilane and ammonia into the reaction vessel; an exhaust pipe connected to the reaction vessel and provided with a second heating unit capable of heating the exhaust pipe at a temperature high enough to gasify an ammonium chloride, a reaction product; an exhaust system capable of exhausting gases from the reaction vessel through the exhaust pipe and of setting a pressure in the interior of the reaction vessel at a predetermined pressure; and a control unit for controlling the exhaust system to set the interior of the reaction vessel at the predetermined pressure and for controlling the supply of hexachlorodisilane and ammonia through the gas supply pipes into the reaction vessel; wherein the control unit is capable of controlling the first heating unit to set the pressure in the interior of the reaction vessel at a temperature capable of causing the thermal decomposition of hexachlorodisilane and of controlling the second heating unit to heat the exhaust pipe at a temperature capable of gasifying the ammonium chloride.

Hexachlorodisilane and ammonia supplied through the gas supply pipes into the reaction vessel are reacted to each other by heat applied thereto by the first heating unit and a silicon nitride film is formed on the workpieces. When the hexachlorodisilane and the ammonium are reacted, hydrogen chloride is produced. Then the surplus ammonia and the hydrogen chloride are reacted to produce ammonium chloride, which is discharged into the exhaust pipe. The ammonium chloride discharged into the exhaust pipe does not sublime (solidify) in the exhaust pipe nor does deposit in the exhaust pipe.

Preferably, the control unit controls the second heating unit so as to heat the exhaust pipe at 150° C. or above, more preferably at a temperature in the range of 190 to 200° C.

When the exhaust pipe is heated at 150° C. or above, the ammonium chloride discharged into the exhaust pipe does not sublimate (solidify) nor does deposit in the exhaust pipe.

According to the present invention, a silicon nitride film forming method comprises: a step of placing workpieces in a reaction vessel; a step of forming a silicon nitride film on the workpieces by supplying hexachlorodisilane and ammonia into the reaction vessel; and a step of exhausting gases from the reaction vessel through an exhaust pipe connected to the reaction vessel; wherein a reaction chamber defined by the reaction vessel is heated at a temperature capable of decomposing hexachlorodisilane by thermal decomposition when supplying hexachlorodisilane and ammonia into the reaction vessel, and the exhaust pipe is heated at a temperature capable of gasifying an ammonium chloride polymer when discharging the gases from the reaction vessel through the exhaust pipe.

Hexachlorodisilane and ammonia supplied into the reaction vessel are reacted to each other and a silicon nitride film is formed on the workpieces. An ammonium chloride, a reaction product is produced when the hexachlorodisilane and the ammonia are reacted, and the ammonium chloride is discharged into the exhaust pipe. The ammonium chloride discharged into the exhaust pipe does not sublimate (solidify) in the exhaust pipe nor does deposit in the exhaust pipe.

Preferably, the exhaust pipe is heated at 150° C. or above, more preferably at a temperature in the range of 190 to 200° C. When the exhaust pipe is heated at 150° C. or above, the ammonium chloride discharged into the exhaust pipe does not sublimate (solidify) nor does deposit in the exhaust pipe.

According to the present invention, a precleaning method of precleaning a silicon nitride film forming system including a reaction vessel into which hexachlorodisilane and ammonia are supplied to form a silicon nitride film on workpieces, and an exhaust pipe connected to the reaction vessel includes a step of supplying ammonia into the reaction vessel, and a step of discharging ammonia from the reaction vessel into the exhaust pipe.

In this precleaning method, ammonia is supplied through the reaction vessel into the exhaust pipe. The ammonia supplied into the exhaust pipe and a Si—Cl—N—H compound (intermediate product) deposited on the inner surface of the exhaust pipe, react to each other to produce a Si—N—H compound.

Preferably, the reaction chamber is heated at a temperature in the range of, for example, 500 to 900° C. during the precleaning method. Preferably, the exhaust pipe is heated at 100° C. or above during the precleaning method. Preferably, the pressure in the interior of the exhaust pipe is set at pressures in the range of 665 to 66500 Pa during the precleaning method.

Preferably, in the precleaning method, an inert gas is supplied through the reaction vessel into the exhaust pipe prior to supplying ammonia through the reaction vessel into the exhaust pipe to clean the exhaust pipe.

Preferably, in the precleaning method, an inert gas is supplied through the reaction vessel into the exhaust pipe after supplying ammonia through the reaction vessel into the exhaust pipe. Thus, ammonia supplied for precleaning can be completely purged away.

DESCRIPTION OF THE PREFERRED EMBODIMENTS

A silicon nitride film forming method, a silicon nitride film forming system and a precleaning method of cleaning the silicon nitride film forming system, embodying the present invention will be described.

First Embodiment

A silicon nitride film forming method and a silicon nitride forming system in a first embodiment will be described as applied to forming a silicon nitride film on semiconductor wafers (workpieces) by using a batch type vertical thermal processing system shown in FIG. 1.

Figure 1:
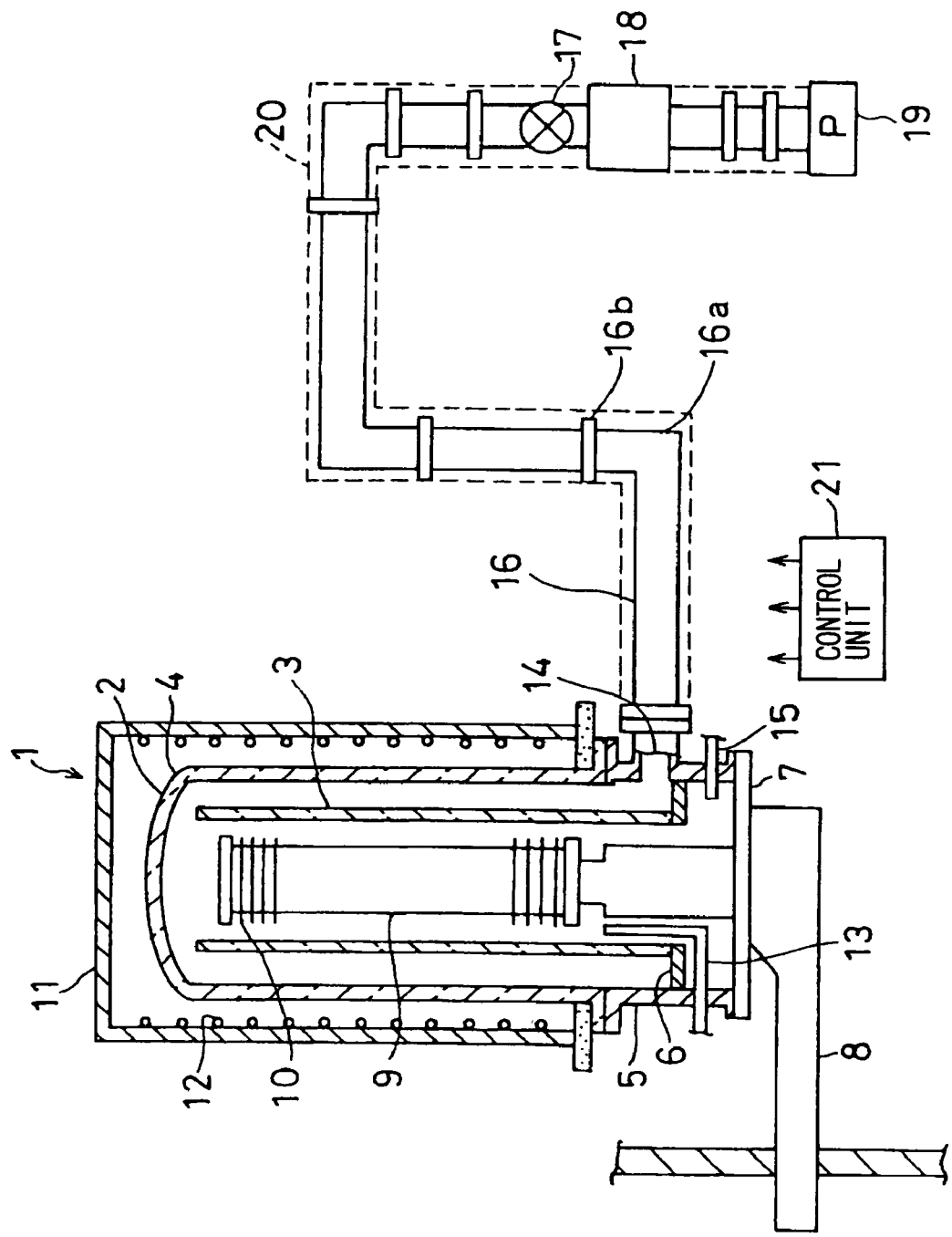
FIG. 1 is a schematic view of a thermal processing system, i.e., a silicon nitride film forming system, in a preferred embodiment according to the present invention.

Referring to FIG. 1, a thermal processing system 1 has a substantially cylindrical reaction vessel 2 extending in a vertical position. The reaction vessel 2 is a double-wall structure consisting of an inner tube 3 defining a film forming region, and an outer tube 4 covering the inner tube 3 so as to define an annular space of a fixed width together with the inner tube 3 and having a top wall. The inner tube 3 and the outer tube 4 are formed of a heat-resisting material, such as quartz.

The outer tube 4 is mounted on a tubular manifold 5 formed of a stainless steel (SUS, JIS). The lower end of the outer tube 4 is joined closely to the manifold 5. The inner tube 3 supported on a support ring 6 formed integrally with the manifold 5 and protruding from the inner surface of the manifold 5.

A lid 7 is disposed beneath the manifold 5. The lid can be vertically moved by a boat elevator 8. The boat elevator 8 raises the lid 7 to close the open lower end of the manifold 5.

A wafer boat 9 formed of, for example, quartz is mounted on the lid 7 the wafer boat 9 holds a plurality of semiconductor wafers 10, i.e., workpieces, at predetermined vertical intervals.

An insulating cover 11 surrounds the reaction vessel 2. The insulating cover 11 is provided, on the inner surface of its side wall, with a reaction vessel heater 12 including, for example, a resistance-heating element.

A plurality of process gas supply pipes 13 are connected to the side wall of the manifold 5 and extend into the inner tube 3. Only one of the process gas supply pipes 13 is shown in FIG. 1. For example, as shown in FIG. 1, each process gas supply pipe 13 is passed through a part of the side wall of the manifold below the support ring 6 (below the inner tube 3), a free end part of each process gas supply pipe 13 is bent upwardly into the inner tube 3. Hexachlorodisilane ($Si_2Cl_6$) and ammonia ($NH_3$), i.e., process gases, are supplied into the inner tube 3. A discharge port 14 is formed in a part of the side wall of the manifold 5 at a level above that of the support ring 6. The discharge port 14 communicates with the annular space between the inner tube 3 and the outer tube 4 of the reaction vessel 2. Hexachlorodisilane and ammonia are supplied through the process gas supply pipes 13 into the inner tube 3 to perform a film forming process. Reaction products produced by the film forming process flows through the annular space between the inner tube 3 and the outer tube 4, and are discharged through the discharge port 14. A purging gas supply pipe 15 for supplying nitrogen gas as a purging gas is connected to a part of the side wall of the manifold below the discharge port 14.

An exhaust pipe 16 is connected hermetically to the discharge port 14. The exhaust pipe 16 is formed by connecting a plurality of pipes 16a by joints 16b. When cleaning the exhaust pipe 16, the joints 16b are removed to disassemble the exhaust pipe 16 into individual pipes 16a, and then the pipes 16a and the joints 16b are cleaned.

A valve 17, a trap 18 and a vacuum pump 19 are placed in the exhaust pipe 16 in that order with respect to a direction in which exhausted gases flows through the exhaust pipe 16. The valve 17 is controlled so as to adjust pressure in the reaction vessel 2 and the exhaust pipe 16 to a predetermined pressure. The trap 18 consists of, for example, a water cooling trap capable of removing the reaction products from the discharged gas. The vacuum pump 19 evacuates the reaction vessel 2 through the exhaust pipe 16 to adjust pressure in the reaction vessel 2 and the exhaust pipe 16. The temperature of the exhaust pipe 16 is adjusted to a predetermined temperature by an exhaust pipe heater 20.

The boat elevator 8, the reaction vessel heater 12, the process gas supply pipes 13, the purging gas supply pipe 15, the valve 17, the vacuum pump 19 and the exhaust pipe heater 20 are connected to a control unit 21. The control unit 21 includes a microprocessor and a process controller. The control unit 21 measures temperatures and pressures in specified parts of the thermal processing system 1, and provides control signals on the basis of measured data to control the parts of the thermal processing system 1.

Figure 2:
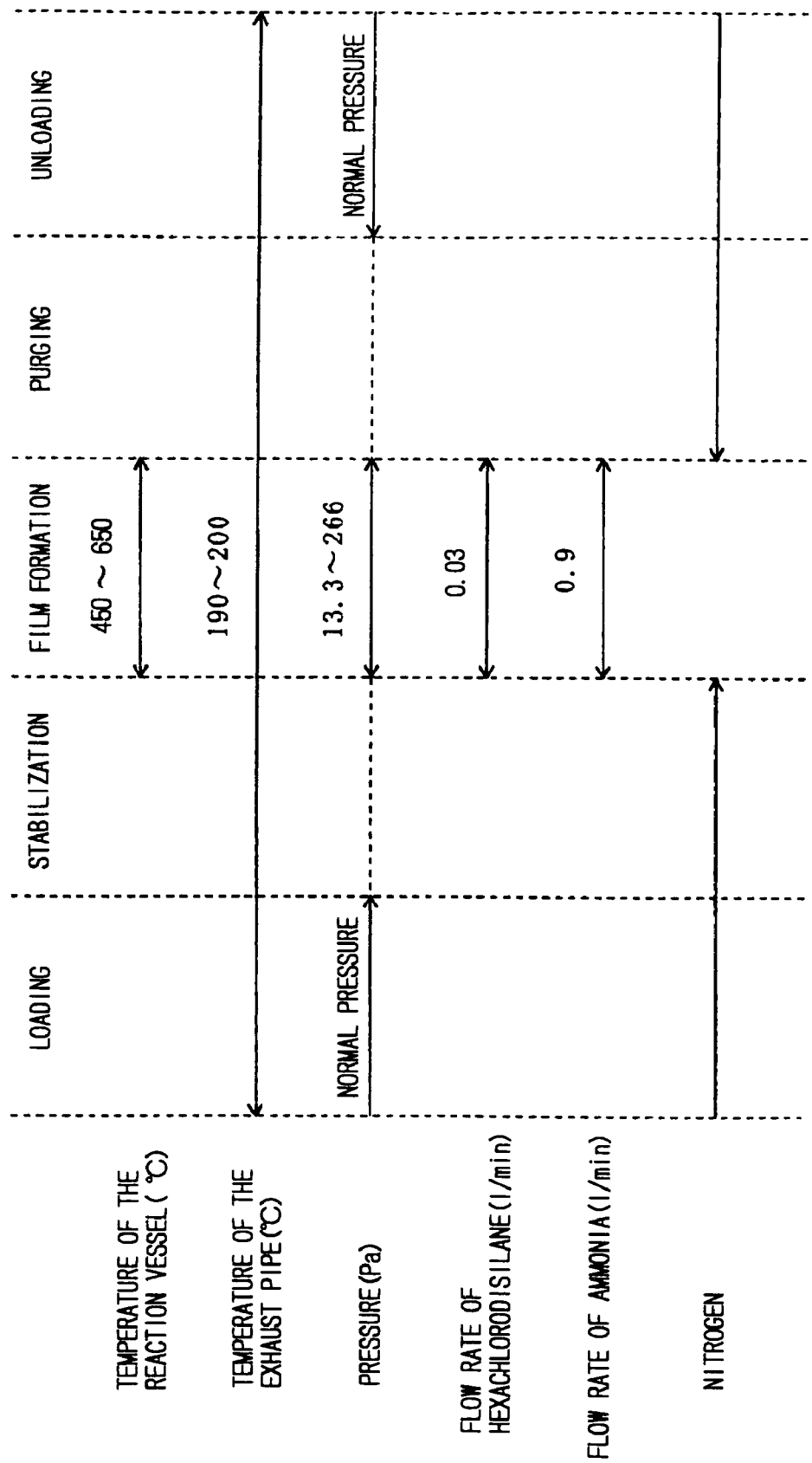
FIG. 2 is a recipe of assistance in explaining a silicon nitride film forming method in a first embodiment according to the present invention.

A silicon nitride film forming method performed by the thus constructed thermal processing system 1 will be described with reference to a recipe (time sequence) shown in FIG. 2. The control unit 21 controls the following respective operations of the components of the thermal processing system 1.

The boat elevator 8 lowers the lid 7, and the wafer boat 9 holding semiconductor wafers 10 is mounted on the lid 7. Nitrogen gas is supplied at a predetermined flow rate through the purging gas supply pipe 15 into the reaction vessel 2, the lid 7 is raided by the boat elevator 8 to load the wafer boat 9 holding the semiconductor wafers 10 into the reaction vessel 2. Thus, the semiconductor wafers 10 are placed in the inner tube 3 of the reaction vessel 2 and the reaction vessel 2 is sealed (loading step).

The exhaust pipe 16 and the valve 17 are heated at a temperature capable of gasifying the hexachlorodisilane polymer, such as a temperature in the range of 190 to 200° C. by the exhaust pipe heater 20. If the temperature of those parts is lower than 190° C., the hexachlorodisilane polymer sublimes (in this case, change from a gaseous state into a solid state) and deposits on the exhaust pipe 16 and the associated parts. If the temperature of those parts is higher than 200° C., parts, such as O rings included in the valve 17, are subject to thermal degradation. Therefore, it is preferable that the temperature of the exhaust pipe 16 and the associated parts is in the range of 190 to 200° C.

After the reaction vessel 2 has been sealed, the valve 17 is opened properly and the vacuum pump 19 is actuated to start evacuating the reaction vessel 2. More specifically, nitrogen gas is supplied at a predetermined flow rate through the purging gas supply pipe 15 into the reaction vessel 2, the opening of the valve 17 is controlled, and the vacuum pump 19 is operated to evacuate the reaction vessel 2. The evacuation of the reaction vessel 2 is continued until the pressure in the reaction vessel 2 changes from a normal pressure to a predetermined pressure in the range of, for example, 13.3 to 266 Pa (0.1 to 2 Torr).

The interior of the reaction vessel 2 is heated at a temperature in the range of, for example, 550 to 650° C. capable of causing the thermal decomposition of hexachlorodisilane by the reaction vessel heater 12. Operations for evacuating the reaction vessel 2 and heating the interior of the reaction vessel 2 are continued until the pressure and temperature in the reaction vessel 2 are stabilized at the predetermined pressure and the predetermined temperature (stabilizing step).

The supply of nitrogen gas through the purging gas supply pipe 15 is stopped after the pressure and temperature in the reaction vessel 2 are stabilized at the predetermined pressure and the predetermined temperature. Subsequently, hexachlorodisilane and ammonia are supplied through the process gas supply pipes 13 into the inner tube 3 at predetermined flow rates, such as 0.03 l/min and 0.9 l/min, respectively.

The hexachlorodisilane and the ammonia supplied into the inner tube 3 are heated and thermally decomposed. Consequently, a silicon nitride film ($Si_3N_4$ film) is formed on the surfaces of the semiconductor wafers 10 (film forming step).

A Si—Cl—N—H compound and an ammonium chloride ($NH_4Cl$), intermediate products are produced by reaction of hexachlorodisilane and ammonia. An exhaust gas containing the Si—Cl—N—H compound and the ammonium chloride ($NH_4Cl$) is discharged from the reaction vessel 2 through the discharge port 14 into the exhaust pipe 16.

Since the exhaust pipe 16 and the valve 17 are heated at the temperature capable of gasifying the $NH_4Cl$, the $NH_4Cl$ is unable to sublime (solidify) in the exhaust pipe 16, but the Si—Cl—N—H compound sublimes in the exhaust pipe 16. The Si—Cl—N—H compound may produce a hydrochloric acid gas when the exhaust pipe 16 is disassembled and open to the atmosphere by maintenance work. However, the generation of the hydrochloric acid gas can be prevented by purging the exhaust pipe 16 with an ammonia, for example, at 13300 Pa before disassembling the exhaust pipe 16.

Ammonium chloride ($NH_4Cl$) is a principal reaction product produced by the interaction of hexachlorodisilane and ammonia. Since the exhaust pipe 16 and the valve 17 are heated at a temperature in the range of 190 to 200° C., the ammonium chloride does not deposit on the exhaust pipe 16, flows into the trap 18 and solidify there.

After the silicon nitride film of a predetermined thickness has been formed on the surfaces of the semiconductor wafers 10, the supply of hexachlorodisilane and ammonia through the process gas supply pipes 13 is stopped. Then, the opening of the valve 17 is controlled, the vacuum pump 19 is operated to exhaust the gas remaining in the reaction vessel 2, nitrogen gas is supplied at a predetermined flow rate through the purging gas supply pipe 15, and the gas remaining in the reaction vessel 2 is exhausted through the exhaust pipe 16 (purging step). Preferably, a purging cycle including operations for discharging the gas from the reaction vessel 2 and supplying nitrogen gas into the reaction vessel 2 is repeated several times to ensure that the gas in the reaction vessel 2 is discharged properly.

Then, nitrogen gas is supplied at a predetermined flow rate through the purging gas supply pipe 15 into the reaction vessel 2 to make the interior of the reaction vessel 2 at the normal pressure, and the wafer boat 9 holding the semiconductor wafers 10 is unloaded from the reaction vessel 2 (unloading step).

As apparent from the foregoing description, the deposition of silane chloride polymer on the exhaust pipe 16 and the associated parts can be prevented because the exhaust pipe 16 and the valve 17 are heated at the temperature capable of gasifying the silane chloride polymer. Thus, it is possible to prevent the generation of hydrochloric acid gas in the exhaust pipe 16 when cleaning the disassembled exhaust pipe 16.

Second Embodiment

Figure 3:
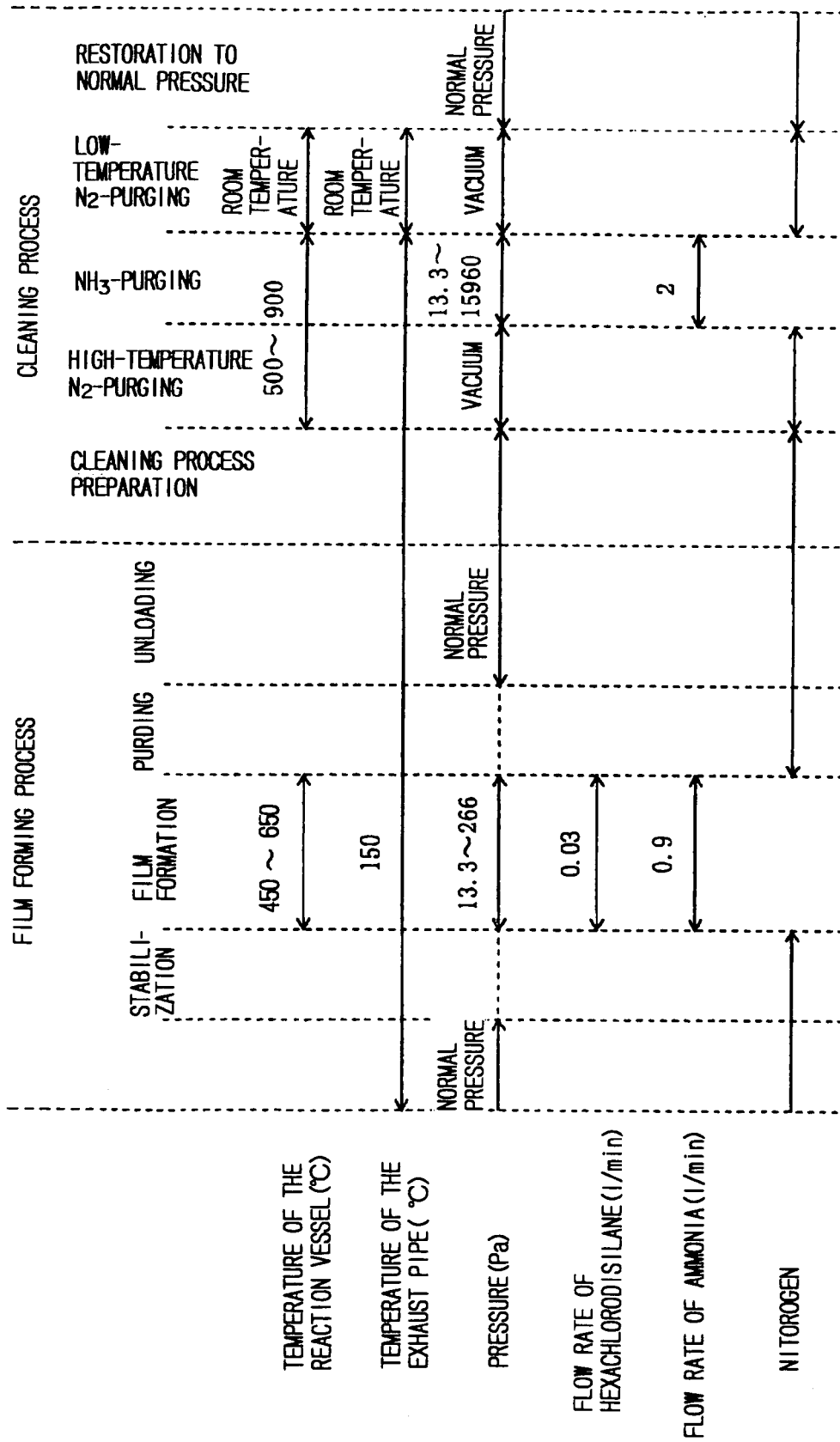
FIG. 3 is a recipe of assistance in explaining a precleaning method in a second embodiment according to the present invention of cleaning a silicon nitride film forming system.

A precleaning method of a silicon nitride film cleaning system in a second embodiment according to the present invention will be described in connection with the thermal processing system 1 in the first embodiment. The precleaning method is performed prior to disassembling and cleaning the thermal processing system 1 after completing the film forming process of forming the silicon nitride film on the semiconductor wafers 10. The precleaning method will be described with reference to a recipe shown in FIG. 3. A film forming process is performed on the same conditions as the first embodiment, except that the exhaust pipe 16 and the valve 17 are heated at 150° C.

The film forming process will be briefly described.

Nitrogen gas is supplied at a predetermined flow rate through the purging gas supply pipe 15 into the reaction vessel 2, and the wafer boat 9 holding the semiconductor wafers 10 is loaded into the reaction vessel 2 (loading step).

The exhaust pipe 16 and the valve 17 are heated at a temperature not lower than 100° C., for example, at 150° C. by the exhaust pipe heater 20. The hexachlorodisilane polymer tends to sublime and deposit on the exhaust valve 16 if the temperature of the exhaust pipe 16 and the valve 17 is below 100° C.

Nitrogen gas is supplied at a predetermined flow rate through the purging gas supply pipe 15 into the reaction vessel 2, while the reaction vessel 2 is evacuated to keep the pressure in the interior of the reaction vessel 2 at a predetermined pressure in the range of, for example, 13.3 to 266 Pa (0.1 to 2 Torr). The interior of the reaction vessel 2 is heated at a temperature in the range of, for example, 550 to 650° C. capable of causing the thermal decomposition of hexachlorodisilane by the reaction vessel heater 12. Operations for evacuating the reaction vessel 2 and heating the interior of the reaction vessel 2 are continued until the pressure and temperature in the reaction vessel 2 are stabilized at the predetermined pressure and the predetermined temperature (stabilizing step).

The supply of nitrogen gas through the purging gas supply pipe 15 is stopped after the pressure and temperature in the reaction vessel 2 are stabilized at the predetermined pressure and the predetermined temperature. Subsequently, hexachlorodisilane and ammonia are supplied through the process gas supply pipes 13 into the inner tube 3 at predetermined flow rates, such as 0.03 l/min and 0.9 l/min, respectively (film forming step).

A Si—Cl—N—H compound (intermediate product) is produced simultaneously with the reaction of hexachlorodisilane and ammonia, and is discharged as an exhaust gas from the reaction vessel 2 through the discharge port 14 into the exhaust pipe 16. Since the exhaust pipe 16 and the valve 17 are heated at 150° C., it is unlikely that the Si—Cl—N—H compound will sublime in the exhaust pipe 16. Thus, it is difficult for the Si—Cl—N—H compound to deposit on the exhaust pipe 16 and the valve 17. However, the deposition of the Si—Cl—N—H compound on the exhaust pipe 16 and the valve 17 cannot perfectly be prevented and some of the Si—Cl—N—H compound may deposit unavoidably on the exhaust pipe 16 and the valve 17.

After the silicon nitride film of a predetermined thickness has been formed on the surfaces of the semiconductor wafers 10, the supply of hexachlorodisilane and ammonia through the process gas supply pipes 13 is stopped. Then, the reaction vessel 2 is evacuated, and nitrogen gas is supplied at a predetermined flow rate through the purging gas supply pipe 15 into the reaction vessel 2 to purge away the gas remaining in the reaction vessel 2 through the exhaust pipe 16 (purging step).

Then, nitrogen gas is supplied at a predetermined flow rate through the purging gas supply pipe 15 into the reaction vessel 2 to keep the pressure in the interior of the reaction vessel 2 at the normal pressure, and the wafer boat 9 holding the semiconductor wafers 10 is unloaded from the reaction vessel 2 (unloading step).

Reaction products including the Si—Cl—N—H compound may deposit on the exhaust pipe 16 and the associated parts after the film forming process has been repeated several times. Upon the deposition of an amount of the reaction products exceeding a predetermined limit, the thermal processing system 1 is disassembled and a cleaning process is performed. The thermal processing system 1 must be precleaned by a precleaning method before the cleaning process. The precleaning method will be described hereinafter.

A predetermined amount of an inert gas, such as nitrogen gas, is supplied through the purging gas supply pipe 15 into the reaction vessel 2, and then the reaction vessel 2 is sealed. Subsequently, nitrogen gas is supplied at a predetermined flow rate and the reaction vessel 2 is evacuated to maintain the interior of the reaction vessel 2 at a high vacuum. The interior of the reaction vessel 2 is heated at a temperature in the range of, for example, 500 to 900° C. by the reaction vessel heater 12 (preparatory step). Hexachlorodisilane can be decomposed at 500° C., and the same is decomposed completely at 900° C.

The interior of the reaction vessel 2 can be heated at temperatures higher than 900° C. However, since hexachlorodisilane is decomposed by heat at 900° C. and parts, such as O rings, of the reaction vessel 2 are thermally degraded when the interior of the reaction vessel 2 is heated at a temperature higher than 900° C., it is preferable that the temperature of the interior of the reaction vessel is in the range of 500 to 900° C. Since hexachlorodisilane is substantially decomposed by heat at 800° C., it is more preferable that the temperature of the interior of the reaction vessel 2 is in the range of 800 to 900° C.

The exhaust pipe 16 and the valve 17 are heated at 150° C. by the exhaust pipe heater 20. Preferably, the exhaust pipe 16 and the associated parts are heated at 100° C. or above to make it difficult for the Si—Cl—N—H compound (intermediate product) to sublime. The exhaust pipe 16 and the valve 17 are heated at 150° C., which is equal to the temperature at which the exhaust pipe 16 and the valve 17 are heated for the film forming process.

An inert gas, such as nitrogen gas, is supplied at a predetermined flow rate through the purging gas supply pipe 15 into the reaction vessel 2 to purge the reaction vessel 2 and the exhaust pipe 16 of the gas remaining therein with nitrogen gas (high-temperature $N_2$-purging step). In the high-temperature $N_2$-purging step, a thermal process is performed to create a state that facilitate reaction between Si—Cl—N—H compound and ammonia in the subsequent $NH_3$-purging step.

Subsequently, the pressure in the reaction vessel 2 and the exhaust pipe 16 is maintained in the range of, for example, 665 to 66500 Pa (5 to 500 Torr). Increase in the pressure in the exhaust pipe 16 can extend time for which the gas flowing through the exhaust pipe 16 stays in the exhaust pipe 16. Therefore it is preferable that the pressure in the reaction vessel 2 and the exhaust pipe 16 is in the range of, for example, 13300 to 15960 Pa (100 to 120 Torr).

The supply of nitrogen gas through the purging gas supply pipe 15 is stopped and ammonia is supplied at a predetermined flow rate of, for example, 2 l/min through the process gas supply pipe 13 into the space in the inner tube 3 to purge the reaction vessel 2 and the exhaust pipe 16 with ammonia ($NH_3$-purging step). In the $NH_3$-purging step, the Si—Cl—N—H compound remaining in the exhaust pipe 16 and the associated parts react with ammonia to produce Si—N—H compound. Heating the exhaust pipe 16 and the valve 17 at 150° C. by the exhaust pipe heater 20 can help the reaction of the Si—Cl—N—H compound with the ammonia.

Then, the reaction vessel 2 is maintained at a high vacuum, and the interior of the reaction vessel 2, the exhaust pipe 16 are cooled to a room temperature, and the supply of ammonia through the process gas supply pipe 13 is stopped. Then, nitrogen gas is supplied at a predetermined flow rate through the purging gas supply pipe 15 into the reaction vessel 2 to purge the reaction vessel 2 and the exhaust pipe 16 with nitrogen gas (low-temperature $N_2$-purging step). The low-temperature $N_2$-purging step can remove ammonia used in the $NH_3$-purging step from the reaction vessel 2 and the exhaust pipe 16.

Nitrogen gas is supplied through the purging gas supply pipe 15 into the reaction vessel 2 to keep the pressure in the interior of the reaction vessel 2 at the normal pressure (normal pressure restoration step).

After the precleaning method is thus completed, the exhaust pipe 16 and the specified parts of the thermal processing system 1 are disassembled and a cleaning process is performed to clean the exhaust pipe 16 and the specified parts individually. In the cleaning process, the joints 16b are removed to disassemble the exhaust pipe 16 into individual pipes 16a, and then the pipes 16a and the joints 16b are cleaned with, for example, hydrofluoric acid solution to remove the Si—N—H compound.

Figure 4:
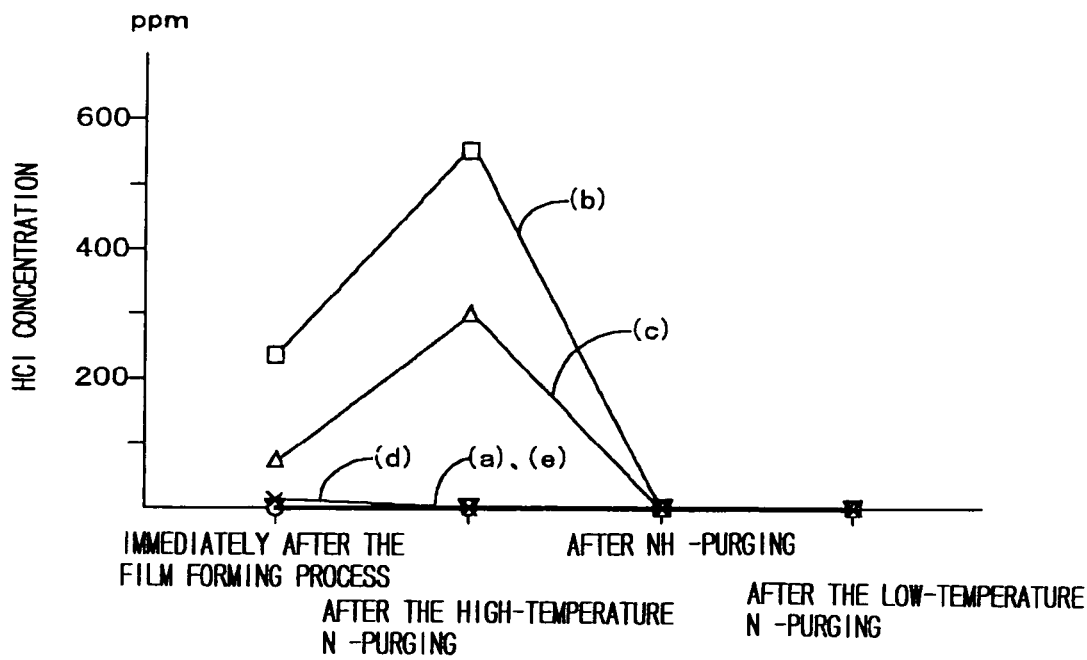
FIG. 4 is a graph showing hydrochloric acid concentration after steps of the second embodiment.
Figure 5:
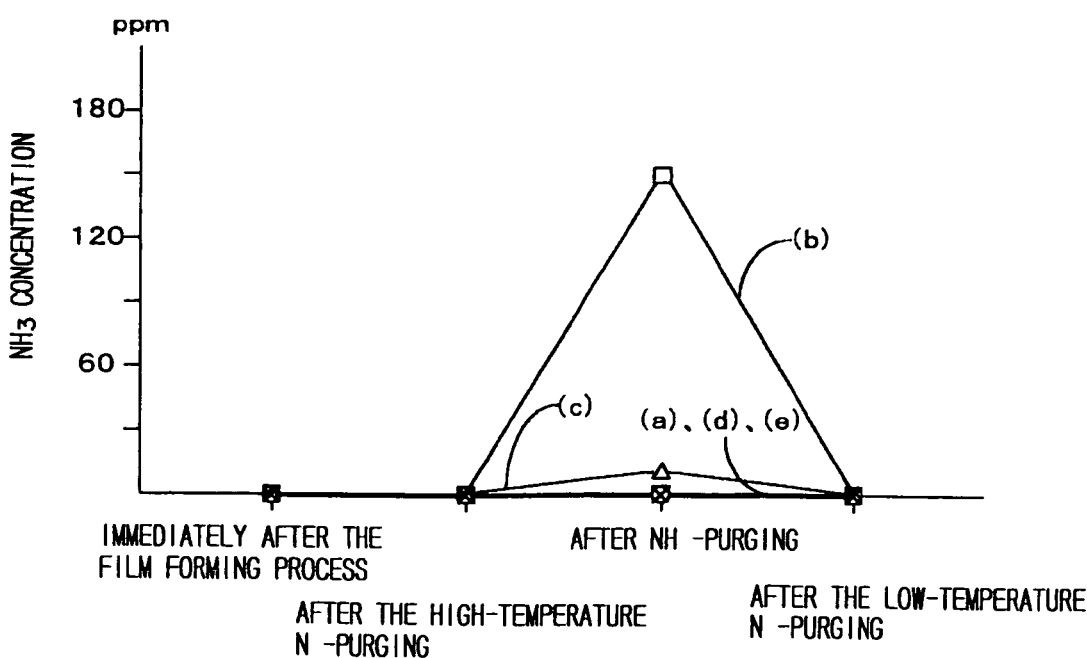
FIG. 5 is a graph showing ammonia concentration after the steps of the second embodiment.
Figure 6:
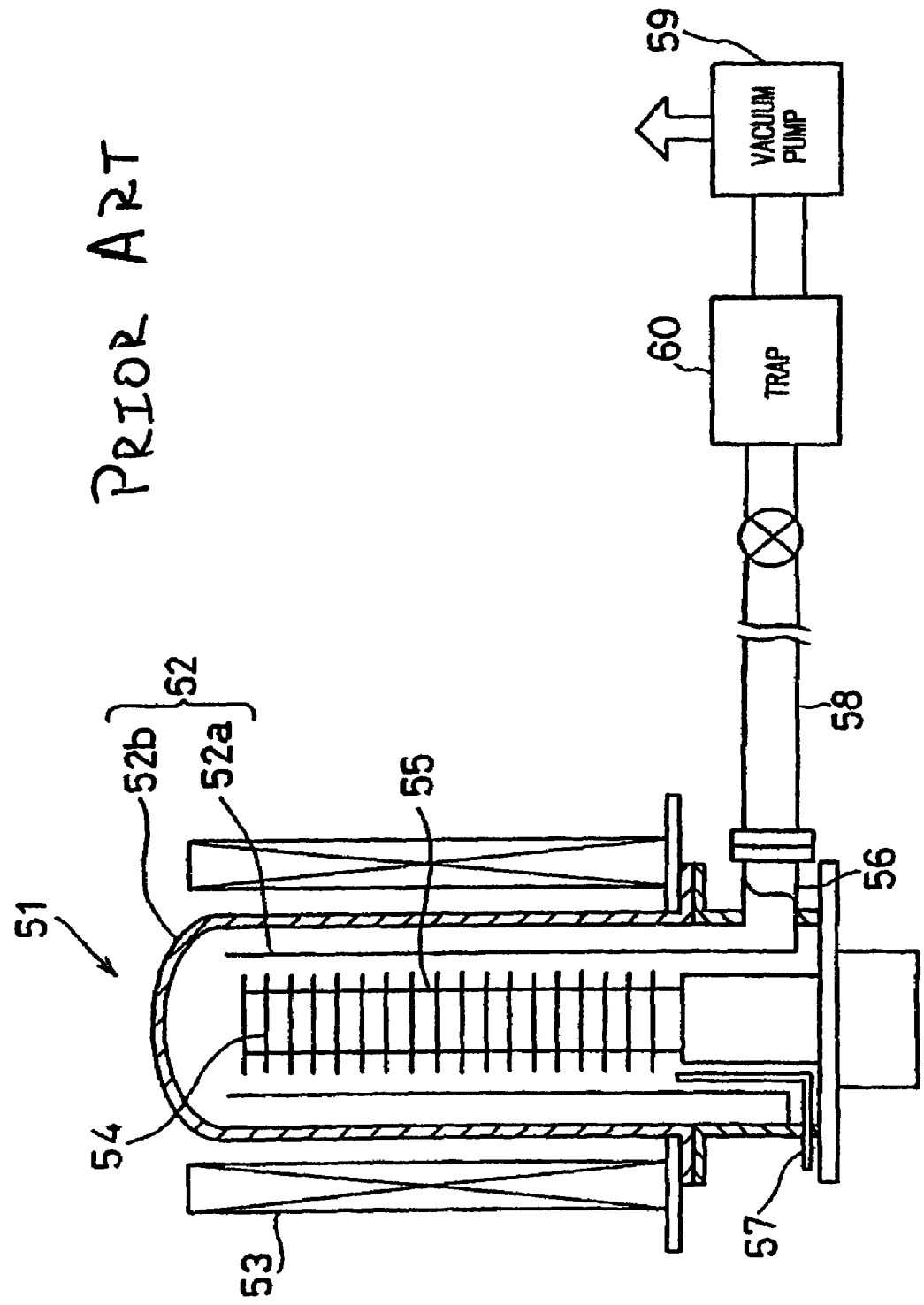
FIG. 6 is a schematic view of a conventional thermal processing system.

Hydrochloric acid concentration and ammonia concentration in five parts in the exhaust pipe 16, i.e., (a) a part in the vicinity of the discharge port 14, (b) a part between the discharge port 14 and the valve 17, (c) a part immediately above the valve 17, (d) a part immediately behind the trap 18 and (e) a part immediately above the vacuum pump 19, were measured with a gas detector immediately after the film forming process, after the high-temperature $N_2$-purging step, after the $NH_3$-purging step, and after the low-temperature $N_2$-purging step respectively. FIGS. 4 and 5 are graphs respectively showing measured hydrochloric acid concentrations and ammonia concentrations.

As shown in FIG. 4, any hydrochloric acid was not detected in any parts in the exhaust pipe 16 after the low-temperature $N_2$ purging step, because a chlorine component of the Si—Cl—N—H compound in the exhaust pipe 16 was reduced by the reaction of the Si—Cl—N—H compound and ammonia by the $NH_3$-purging step.

As shown in FIG. 5, ammonia was not detected at all in any parts in the exhaust pipe 16 after the low-temperature $N_2$-purging step, because the exhaust pipe 16 was purged of ammonia by the low-temperature $N_2$-purging step.

Hydrochloric acid concentration of the atmosphere was measured when the exhaust pipe 16 was disassembled after the precleaning method. Hydrochloric acid was not detected at all in the exhaust pipe 16, which proved that hydrochloric acid was not produced when the exhaust pipe was disassembled. Thus, it was proved that the chlorine component of the Si—Cl—N—H compound deposited on the exhaust pipe 16 was reduced and the safety of work for disassembling the exhaust pipe 16 was insured.

As apparent from the foregoing description, according to this embodiment, since the interior of the reaction vessel 2 is heated at a temperature in the range of 500 to 900° C. and the exhaust pipe 16 is purged with ammonia, the chlorine component of the Si—Cl—N—H compound deposited on the exhaust pipe can be reduced and the exhaust pipe can be safely disassembled and cleaned.

Since the high-temperature $N_2$-purging step is performed before the $NH_3$-purging step, the reaction of the Si—Cl—N—H compound and the ammonia can be facilitated. Since the low-temperature $N_2$-purging step is performed after the $NH_3$-purging step, exhaust pipe 16 can be purged of ammonia used by the $NH_3$-purging step and remaining in the exhaust pipe 16.

The following modifications of the foregoing embodiments are possible.

Although the first embodiment heats the exhaust pipe 16 and the associated parts at a temperature in the range of 190 to 200° C., the exhaust pipe 16 and the associated parts may be heated at a temperature capable of gasifying the $NH_4Cl$ and the same may be heated at a temperature higher than 200° C. If the exhaust pipe 16 and the associated parts are heated at a temperature higher than 200° C., it is preferable to use heat-resistant parts as parts of the exhaust pipe 16 in order that those parts may not be deteriorated by heat.

Although in the second embodiment, the high-temperature $N_2$-purging step is performed before the $NH_3$-purging step, the high-temperature $N_2$-purging step may be omitted. When the high-temperature $N_2$-purging step is omitted, the Si—Cl—N—H compound (intermediate product) deposited on the exhaust pipe 16 and the associated parts can react with ammonia in the $NH_3$-purging step. However, it is preferable to heat the reaction vessel 2 at a high temperature in the $NH_3$-purging step or to perform the $NH_3$-purging step for an extended period of time to ensure the complete reaction of the Si—Cl—N—H compound deposited on the exhaust pipe 16 and the associated parts with ammonia.

Although in the second embodiment, the low-temperature $N_2$-purging step is performed after the $NH_3$-purging step, the low-temperature $N_2$-purging step may be omitted. If the $N_2$-purging step is omitted, the Si—Cl—N—H compound deposited on the exhaust pipe 16 and the associated parts can react with ammonia. In the low-temperature $N_2$-purging step, similarly to the $NH_3$-purging step, the exhaust pipe 16 and the valve 17 may be heated at 150° C., which enables the further effective removal of ammonia remaining in the exhaust pipe 16.

Although in the second embodiment, the exhaust pipe 16 and the associated parts are heated at 150° C. in the $NH_3$-purging step, the exhaust pipe 16 and the associated parts do not necessarily need to be heated. The Si—Cl—

N—H compound deposited on the exhaust pipe 16 and the associated parts can also react with ammonia in the NH$_3$-purging step.

In the first embodiment, parts of the process gas supply pipes 13 extending outside the manifold 5 may be heated by a heater to decompose hexachlorodisilane and substances produced by the thermal decomposition of hexachlorodisilane may be supplied into the reaction vessel 2. Thus, hexachlorodisilane can be completely decomposed and substances produced through the thermal decomposition of hexachlorodisilane can be supplied into the reaction vessel 2.

Although the invention has been described as applied to the batch type vertical thermal processing system provided with the double-wall processing vessel 2 consisting of the inner tube 3 and the outer tube 4, the present invention is not limited thereto in its practical application and is applicable to various types of processing systems provided with a single-wall processing vessel for forming a silicon nitride film on workpieces. The workpieces are not limited to semiconductor wafers 10 and may be, for example, glass substrates for LCDs.

As apparent from the foregoing description, according to the present invention, a silicon nitride film can be formed on the workpieces without depositing the Si—Cl—N—H compound on the exhaust system, and the Si—Cl—N—H compound deposited on the exhaust system can be removed.

What is claimed is:

1. A silicon nitride film forming system comprising:
   a reaction vessel for holding a workpiece therein and provided with a first heating unit for heating the workpiece at a process temperature;
   a gas supply pipe for carrying hexachlorodisilane and ammonia into the reaction vessel;
   an exhaust pipe connected to the reaction vessel and provided with a second heating unit for heating the exhaust pipe at a temperature high enough to gasify ammonium chloride;
   an exhaust system for exhausting gas from the reaction vessel through the exhaust pipe and thereby setting the pressure in an interior of the reaction vessel at a predetermined pressure; and
   a control unit for controlling the exhaust system to set the pressure in the interior of the reaction vessel at the predetermined pressure and for controlling the supply of hexachlorodisilane and ammonia through the gas supply pipes into the reaction vessel, the control unit causing the gas supply pine to carry hexachlorodisilane and ammonia into the reaction vessel, and the first heating unit to set a temperature of the interior of the reaction vessel to a temperature causing the thermal decomposition of hexachlorodisilane to form a silicon nitride film on the workpiece by reacting the hexachlorodisilane and the ammonia in the reaction vessel,
   causing the gas supply pipe to further supply ammonia into the reaction vessel after the silicon nitride film has been formed,
   causing the second heating unit to heat the exhaust pipe at a temperature capable of gasifying ammonium chloride, and
   causing the exhaust pipe to discharge the ammonia from the reaction vessel such that the ammonia reacts with a Si—Cl—N—H compound in the exhaust pipe to produce a Si—N—H compound to preclean inside of the exhaust pipe.

2. The silicon nitride film forming system according to claim 1, wherein the control unit controls the second heating unit so as to heat the exhaust pipe at 150 C or above.

3. The silicon nitride film forming system according to claim 2, wherein the control unit controls the second heating unit so as to heat the exhaust pipe at a temperature in the range of 190 to 200 C.

4. A silicon nitride film forming method comprising the steps of:
   placing a workpiece in a reaction vessel having a reaction chamber;
   heating the reaction chamber to a temperature sufficient to decompose hexachlorodisilane by thermal decomposition;
   forming a silicon nitride film on the workpiece by supplying hexachlorodisilane and ammonia into the reaction vessel while the reaction chamber is heated to said sufficient temperature;
   supplying ammonia into the reaction vessel after completion of forming the silicon nitride film;
   exhausting ammonia from the reaction vessel through an exhaust pipe connected to the reaction vessel; and
   reacting the ammonia with a Si—Cl—N—H compound remaining in the exhaust pipe to produce a Si—N—H compound,
   wherein the exhaust pipe is heated at a temperature gasifying animonium chloride when discharging the gases from the reaction vessel through the exhaust pipe.

5. The silicon nitride film forming method according to claim 4, wherein the exhaust pipe is heated at 150 C or above the exhaust pipe is heated at a temperature in the range of 190 to 200 C.

6. The silicon nitride film forming method according to claim 5, wherein the exhaust pipe is heated at a temperature in the range of 190 to 200 C.

* * * * *